(12) United States Patent
Goto et al.

(10) Patent No.: US 9,130,598 B2
(45) Date of Patent: Sep. 8, 2015

(54) DECODING APPARATUS, DECODING METHOD, AND DECODING PROGRAM FOR USE IN QUANTUM ERROR CORRECTION

(71) Applicant: KABUSHIKI KAISHA TOSHIBA, Minato-ku (JP)

(72) Inventors: Hayato Goto, Kawasaki (JP); Hironori Uchikawa, Fujisawa (JP); Kouichi Ichimura, Yokohama (JP); Satoshi Nakamura, Tokyo (JP); Mamiko Kujiraoka, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 16 days.

(21) Appl. No.: 14/065,612

(22) Filed: Oct. 29, 2013

(65) Prior Publication Data

US 2014/0289583 A1    Sep. 25, 2014

(30) Foreign Application Priority Data

Oct. 30, 2012 (JP) .................... 2012-239558

(51) Int. Cl.
*H03M 13/41* (2006.01)
*H03M 13/39* (2006.01)
*H03M 13/45* (2006.01)

(52) U.S. Cl.
CPC .......... *H03M 13/45* (2013.01); *H03M 13/3961* (2013.01); *H03M 13/41* (2013.01); *H03M 13/4107* (2013.01); *H03M 13/3905* (2013.01)

(58) Field of Classification Search
CPC ................ H03M 13/2957; H03M 13/3738; H03M 13/6343; H03M 13/1102; H03M 13/2933; H03M 13/1111; H03M 13/3905; H03M 13/3961; H03M 13/41; H03M 13/4107

USPC .......... 714/780, 794, 781, 795, 784, 800, 755, 714/758, 796, 792
See application file for complete search history.

(56) References Cited

U.S. PATENT DOCUMENTS 5,566,191 A * 10/1996 Ohnishi et al. ................ 714/794
5,608,737 A * 3/1997 Kimura et al. ................ 714/746
(Continued)

OTHER PUBLICATIONS

David Poulin, "Optimal and efficient decoding of concatenated quantum block codes", Physical Review A, vol. 74, No. 052333, 2006, pp. 1-5.
(Continued)

*Primary Examiner* — James C Kerveros
(74) *Attorney, Agent, or Firm* — Oblon, McClelland, Maier & Neustadt, L.L.P.

(57) ABSTRACT

According to one embodiment, a decoding apparatus includes first and second acquisition units, a holding unit, a calculation unit, and a decision unit. The first acquisition unit acquires first measurement values of measurements performed to measure an eigenvalue of an encoded Z operator to a first encoded qubit of the two encoded qubits. The second acquisition unit acquires second measurement values of measurements performed to measure an eigenvalue of an encoded X operator to a second encoded qubit of the two encoded qubits. The holding unit holds error probabilities for the first measurement values and the second measurement values. The calculation unit calculates probabilities for measurement values of an encoded Bell measurement by using the first measurement values, the second measurement values, and the error probabilities. The decision unit decides measurement values of the encoded Bell measurement, based on the calculated probabilities.

12 Claims, 7 Drawing Sheets

(56) References Cited

U.S. PATENT DOCUMENTS

| | | | |
|---|---|---|---|
| 5,768,297 A * | 6/1998 | Shor | 714/763 |
| 6,128,764 A * | 10/2000 | Gottesman | 714/785 |
| 6,240,145 B1 * | 5/2001 | Koizumi | 375/341 |
| 6,289,059 B1 * | 9/2001 | Yamaguchi et al. | 375/341 |
| 6,798,852 B2 * | 9/2004 | Khayrallah et al. | 375/341 |
| 6,996,762 B2 * | 2/2006 | Kuo et al. | 714/749 |
| 7,170,946 B2 * | 1/2007 | Huang | 375/265 |
| 7,178,093 B2 * | 2/2007 | Chen et al. | 714/796 |
| 7,391,826 B2 * | 6/2008 | Claussen et al. | 375/340 |
| 8,051,366 B2 * | 11/2011 | Maeto | 714/795 |
| 8,261,163 B2 * | 9/2012 | Motozuka | 714/780 |
| 8,332,222 B2 * | 12/2012 | Chung et al. | 704/242 |
| 8,386,899 B2 | 2/2013 | Goto et al. | |

OTHER PUBLICATIONS

E. Knill, "Quantum computing with realistically noisy devices", Nature, vol. 434, Mar. 3, 2005, pp. 39-44.

* cited by examiner

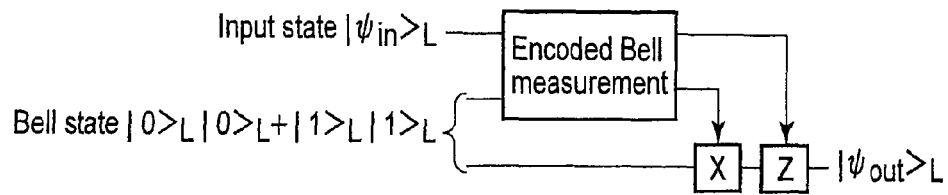
F I G. 1
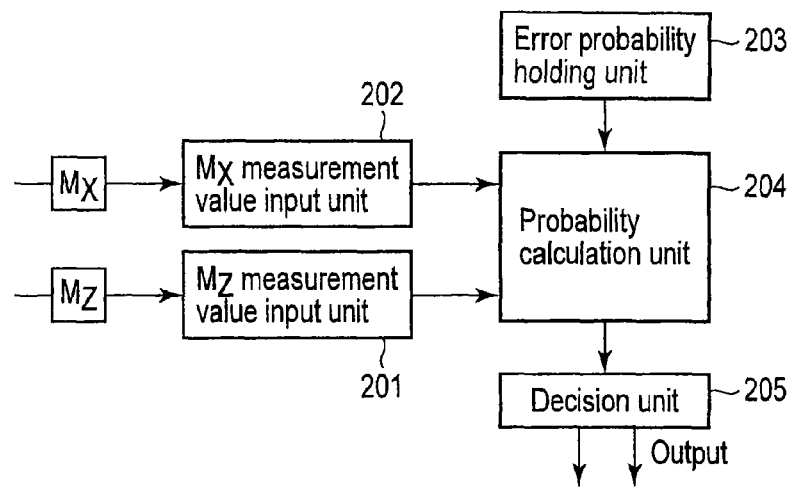
F I G. 2
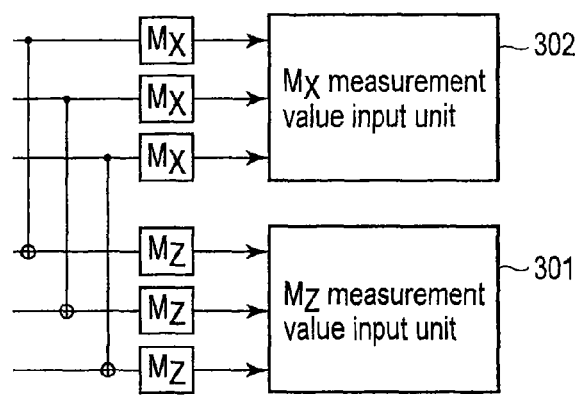
F I G. 3

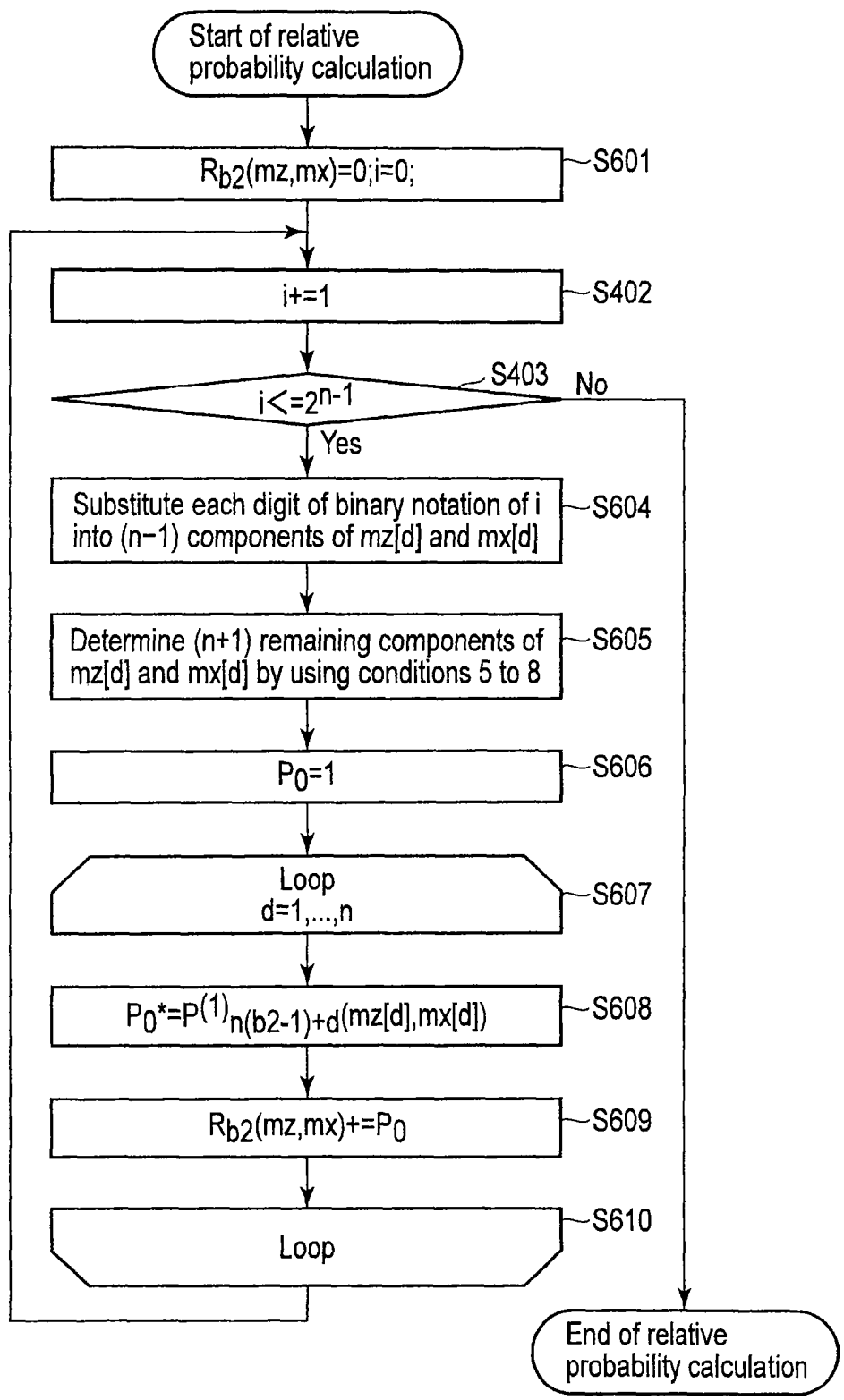
F I G. 6

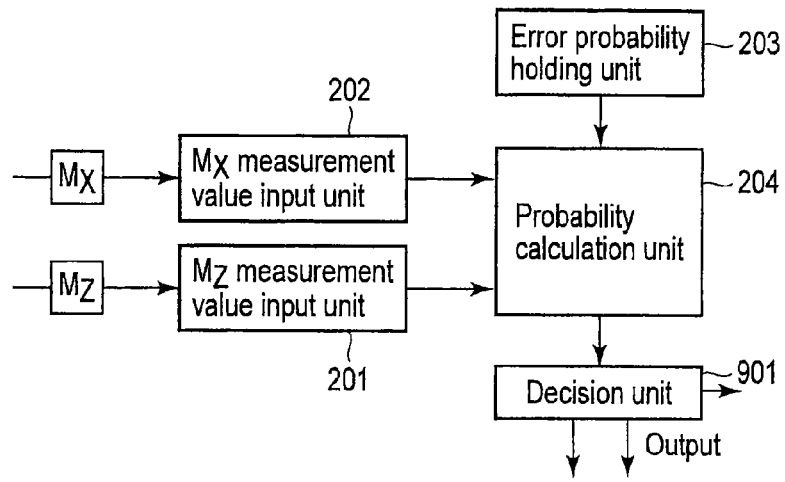
F I G. 9
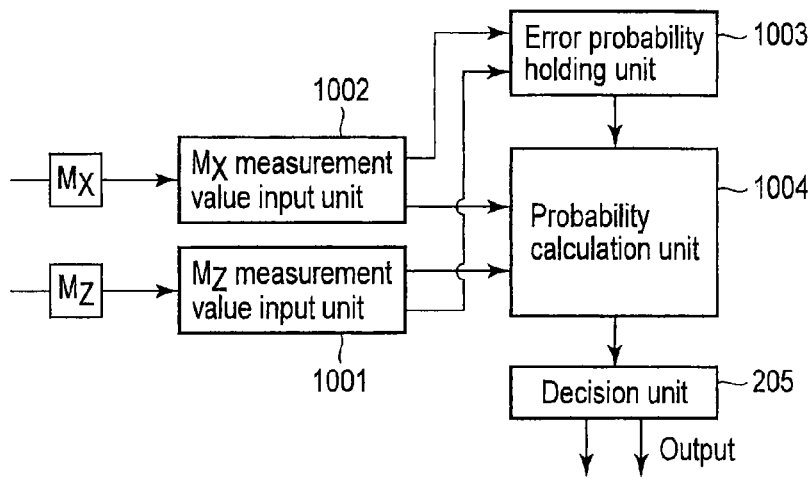
F I G. 10
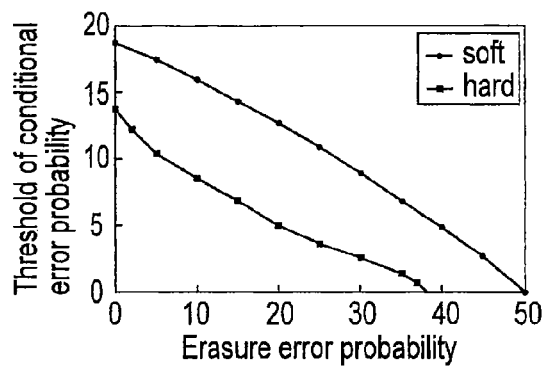
F I G. 11

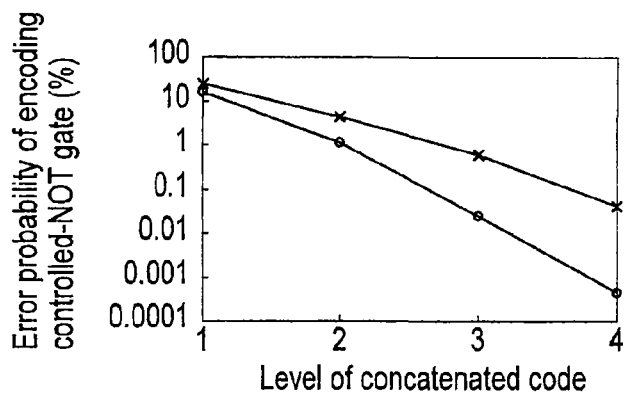
F I G. 14
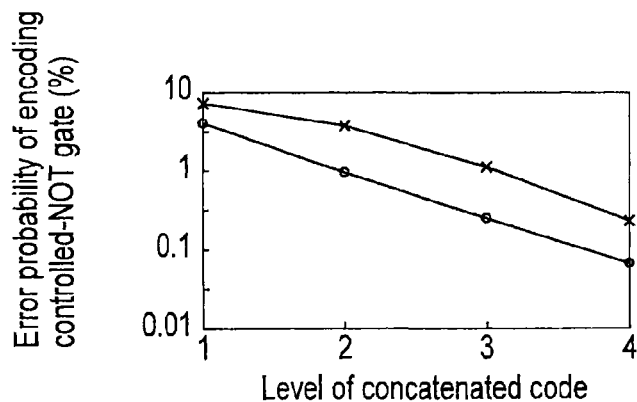
F I G. 15
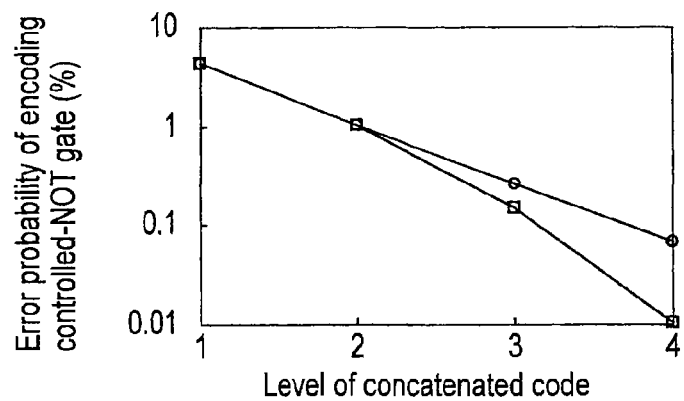
F I G. 16

DECODING APPARATUS, DECODING METHOD, AND DECODING PROGRAM FOR USE IN QUANTUM ERROR CORRECTION

CROSS-REFERENCE TO RELATED APPLICATIONS

This application is based upon and claims the benefit of priority from Japanese Patent Application No. 2012-239558, filed Oct. 30, 2012, the entire contents of which are incorporated herein by reference.

FIELD

Embodiments described herein relate generally to a decoding apparatus, decoding method, and decoding program for use in quantum error correction and fault-tolerant quantum computation.

BACKGROUND

Since a quantum computer uses the state of quantum mechanical superposition, decoherence by which this state breaks causes a memory error or gate error. This is a problem that is unique to the quantum computer and does not arise in the conventional classical computers. Therefore, quantum error correction capable of correcting an error like this and fault-tolerant quantum computation that performs reliable quantum computation by using the quantum error correction are regarded as indispensable in the quantum computer.

Theoretically, reliable quantum computation can be executed as long as possible if the error probability is lower than a certain threshold (the threshold theorem). The threshold depends on the method of fault-tolerant quantum computation, and the present highest value is still low, i.e., about 1%. In addition, even when the threshold is 1%, the resources (the qubit count and (or) the gate count) become enormous. Therefore, demands have arisen for a better fault-tolerant quantum computation method.

Classical error correction has dramatically improved the performance by changing algebraic hard-decision decoding to soft-decision decoding based on probabilistic inference. Accordingly, it may be possible to improve the performance of fault-tolerant quantum computation by soft-decision decoding. Note that there is a related art of quantum error correction using soft-decision decoding based on probabilistic inference.

Unfortunately, fault-tolerant quantum computation using soft-decision decoding has not been studied yet, and its performance is unknown.

BRIEF DESCRIPTION OF THE SEVERAL VIEWS OF THE DRAWING

FIG. 1 is a view showing error-correcting teleportation;
FIG. 2 is a view showing a decoding apparatus according to the first embodiment;
FIG. 3 is a view for explaining transversality as the feature of Z·X separation type stabilizer codes;
FIG. 6 is a flowchart of subroutine 1 of the probability calculation unit of the decoding apparatus according to the first embodiment;
FIG. 9 is a view showing a decoding apparatus according to the second embodiment;
FIG. 10 is a view showing a decoding apparatus according to the third embodiment;
FIG. 11 is a view showing the performance of the decoding apparatus according to the third embodiment;
FIG. 14 is a graph showing the simulation results of the first example;
FIG. 15 is a graph showing the simulation results of the third example;
and
FIG. 16 is a graph showing the simulation results of the fourth example.

DETAILED DESCRIPTION

Figure 4:
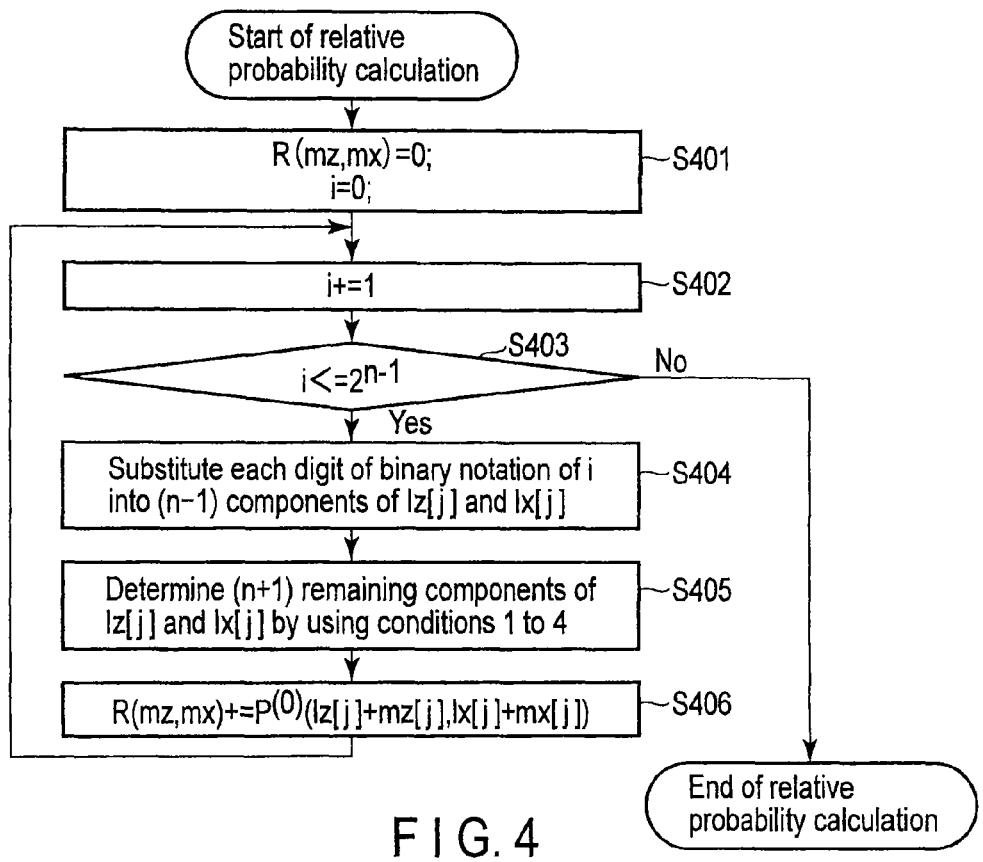
FIG. 4 is a flowchart of a subroutine performed by a probability calculation unit of the decoding apparatus according to the first embodiment.

Decoding apparatuses, decoding methods, and decoding programs according to embodiments will be explained in detail below with reference to the accompanying drawing. Note that in the following embodiments, parts denoted by the same reference numbers perform the same operations, and a repetitive explanation will be omitted.

The embodiments have been made in consideration of the above situations, and provide a decoding apparatus, decoding method, and decoding program for performing soft decision that improves the performance of fault-tolerant quantum computation.

According to one embodiment, a decoding apparatus for use in encoded Bell measurement for two encoded qubits, includes a first acquisition unit, a second acquisition unit, a holding unit, a calculation unit, and a decision unit. The first acquisition unit acquires first measurement values of measurements performed to measure an eigenvalue of an encoded Z operator with respect to a first encoded qubit of the two encoded qubits. The second acquisition unit acquires second measurement values of measurements performed to measure an eigenvalue of an encoded X operator with respect to a second encoded qubit of the two encoded qubits. The holding unit holds error probabilities for the first measurement values and the second measurement values. The calculation unit calculates probabilities for measurement values of the encoded Bell measurement by using the first measurement values, the second measurement values, and the error probabilities. The decision unit decides a measurement value of the encoded Bell measurement, based on the probabilities calculated by the calculation unit.

When compared to the conventional methods, the decoding apparatuses, decoding methods, and decoding programs of the embodiments can remarkably improve the decoding performance of encoded Bell measurement for use in error-correcting teleportation or an encoding controlled-NOT gate. As a result, the performance of fault-tolerant quantum computation can be improved.

(First Embodiment)

This embodiment focuses attention on error-correcting teleportation as a quantum error correction method suitable for fault-tolerant quantum computation. FIG. 1 shows the operation of error-correcting teleportation (see E. Knill, Nature 434, 39 [2005]).

In error-correcting teleportation, so-called Bell measurement is performed between an input state ((1-1)) as an error correction target and a first qubit in a Bell state ((1-2)). In the following description, ((E1-E2)) means an expression or symbol indicated by (E1-E2). Each of E1 and E2 represents an integer of 1 or more. For example, "an input state ((1-1))" means "an input state $|\psi_{in}\rangle_L$".

$$|\psi_{in}\rangle_L \quad (1\text{-}1)$$

$$|0\rangle_L|0\rangle_L+|1\rangle_L|1\rangle_L \quad (1\text{-}2)$$

Each qubit is encoded into a given quantum error correction code in advance (a suffix L represents this). Therefore, this Bell measurement will be called "encoded Bell measurement" hereinafter. Since each bit is encoded beforehand, it is possible to obtain highly reliable measurement results by encoded Bell measurement. An encoded X gate and encoded Z gate are executed on a second qubit in the Bell state in accordance with the measurement results of this encoded Bell measurement. The second qubit ((2-1)) in the Bell state thus obtained is in a state in which an error of the input state ((1-1)) is corrected. This is error-correcting teleportation.

$$|\psi_{out}\rangle_L \quad (2\text{-}1)$$

Encoded Bell measurement normally includes an encoding controlled-NOT gate, and subsequent eigenvalue measurements of an encoded Z operator and encoded X operator. Conventionally, hard-decision decoding is independently performed on the measurement results of two encoded qubits. By contrast, a decoding apparatus of this embodiment simultaneously processes the measurement results of two encoded qubits, and estimates and determines measurement results by soft-decision decoding based on probabilistic inference.

Next, a decoding apparatus according to the first embodiment will be explained with reference to FIG. 2. FIG. 2 shows the arrangement of the decoding apparatus according to the first embodiment.

The decoding apparatus of this embodiment includes an $M_z$ measurement value input unit 201, $M_x$ measurement value input unit 202, error probability holding unit 203, probability calculation unit 204, and decision unit 205.

Note that all decoding apparatuses of embodiments are applicable to all types of quantum computers regardless of how physical qubits are implemented. (Examples of the physical qubits are the polarization/space modes of a photon, the energy levels, electron spins, and nuclear spins of cooled ions or neutral atoms, electron spins and nuclear spins in a solid, superconducting Josephson qubits, and the energy levels and electron spins of semiconductor quantum dots).

$M_z$ and $M_x$ respectively represent units of physical qubit measurements performed for the eigenvalue measurements of the encoded Z operator and encoded X operator necessary for encoded Bell measurement. The $M_z$ measurement value input unit 201 and $M_x$ measurement value input unit 202 respectively receive the measurement values of $M_z$ and $M_x$ and output them to the probability calculation unit 204.

The error probability holding unit 203 holds the error probabilities for the measurement values of $M_z$ and $M_x$ in advance, or holds an externally input error probabilities. The error probability holding unit 203 outputs this error probabilities to the probability calculation unit 204. Note that this error probabilities can be updated as needed.

By using the measurement values of $M_z$ and $M_x$ respectively input from the $M_z$ measurement value input unit 201 and $M_x$ measurement value input unit 202, the error probabilities for the measurement values of Ms and $M_x$, which are input from the error probability holding unit 203, and information of the quantum error correction code, the probability calculation unit 204 calculates the probabilities for the measurement values of Bell measurement, i.e., calculates the probabilities for the eigenvalues of the encoded Z operator with respect to the first qubit in the Bell state, and the probabilities for the eigenvalues of the encoded X operator with respect to the input state, and outputs the calculated probabilities to the decision unit 205. Note that the quantum error correction code information is held in advance or externally input and held.

Based on the probabilities input from the probability calculation unit 204, the decision unit 205 decides the measurement values of Bell measurement, i.e., the measurement value of the eigenvalue of the encoded Z operator with respect to the first qubit in the Bell state, and the measurement value of the eigenvalue of the encoded X operator with respect to the input state. Then, the decision unit 205 outputs the measurement values and terminates the decoding process.

A standard method of the above-mentioned decision is a method of detecting a maximum one of the probabilities input from the probability calculation unit 204, and decides that the corresponding eigenvalues are the measurement values.

The operation of the probability calculation unit 204 of the first embodiment will be explained in more detail below. (The operation of the probability calculation unit 204 herein explained similarly applies to the second embodiment, and almost similarly applies to a probability calculation unit 1004 of the third and fourth embodiments to be described later.)

Assume that the quantum error correction code is a stabilizer code (see M. A. Nielsen and I. L. Chuang, Quantum Information and Computation, Cambridge Univ. Press [2000], Chapter 10, pp. 425-499). For the sake of simplicity, the explanation will be made by assuming that one qubit is encoded by n qubits. However, the same operation applies even when two or more qubits are encoded.

Assume that each stabilizer generator includes only a Z operator and identity operator, or only an X operator and identity operator, and these stabilizer generators will be called a Z stabilizer generator and X stabilizer generator. A stabilizer code like this will be called "a Z·X separation type stabilizer code". (This code is also called a CSS code, and a typical example is a Steane's 7-qubit code. See M. A. Nielsen and I. L. Chuang, Quantum Information and Computation, Cambridge Univ. Press [2000], Chapter 10, pp. 425-499). Letting $n_z$ be the number of Z stabilizer generators and $n_x$ be that of X stabilizer generators, $n=n_z+n_x+1$ holds. Assume also that an encoded Z operator $Z_L$ includes only the Z operator and identity operator, and an encoded X operator $X_L$ includes only the X operator and identity operator.

An important property of the Z·X separation type stabilizer code is the ability to transversally execute the encoded controlled-NOT gate and the measurements of the eigenvalues of the encoded Z operator and encoded X operator necessary for encoded Bell measurement (see M. A. Nielsen and I. L. Chuang, Quantum Information and Computation, Cambridge Univ. Press [2000], Chapter 10, pp. 425-499). That is, to execute the encoded controlled-NOT gate on two encoded qubits, the physical controlled-NOT gate need only be executed on the $j^{th}$ physical qubit (j is an integer of 1 to n) of each encoded qubit. Also, to measure the eigenvalue of the encoded Z operator with respect to a given encoded qubit, the eigenvalue of the Z operator need only be measured for the physical qubit of the encoded qubit. This applies to eigenvalue measurement of the encoded X operator. FIG. 3 shows the foregoing (when n=3). An $M_z$ measurement value input unit 301 receives three $M_z$ measurement values, and an $M_x$ measurement value input unit 302 receives three $M_x$ measurement values.

In the following explanation, the stabilizer generator, encoded Z operator $Z_L$, and encoded X operator $X_L$ are each represented by a matrix containing 0 and 1 as components. When n=4, for example, Z stabilizer generator $S_z$=ZIIZ is represented by matrix $S_z$=(1 0 0 1) (I is an identity operator). Similarly, X stabilizer generator $S_x$=XIIX is represented by $S_x$=(1 0 0 1).

Also, measurement values ((3-1)) input to the $M_z$ measurement value input unit 201, measurement values ((3-2)) input to the $M_x$ measurement value input unit 202, and errors ((4-1)) and ((4-2)) for these measurement values are each represented by a matrix (or vector) containing 0 and 1 as components.

$$\{m_{zj} \mid j = 1, 2, \ldots, n\} \tag{3-1}$$

$$\{m_{xj} \mid j = 1, 2, \ldots, n\} \tag{3-2}$$

$$\{e_{zj} \mid j = 1, 2, \ldots, n\} \tag{4-1}$$

$$\{e_{xj} \mid j = 1, 2, \ldots, n\} \tag{4-2}$$

For example, if ((5-1)) holds for n=4, this is represented by ((5-2)).

$$m_{z1} = 1, m_{z2} = -1, m_{z3} = -1, m_{z4} = 1 \tag{5-1}$$

$$\vec{m_z} = \begin{pmatrix} 0 \\ 1 \\ 1 \\ 0 \end{pmatrix} \tag{5-2}$$

Likewise, ((6-1)) is represented by ((6-2)).

$$m_{x1} = 1, m_{x2} = -1, m_{x3} = -1, m_{x4} = 1 \tag{6-1}$$

$$\vec{m_x} = \begin{pmatrix} 0 \\ 1 \\ 1 \\ 0 \end{pmatrix} \tag{6-2}$$

The probability calculation unit 204 calculates the probabilities ((7-1)) for the measurement values of encoded Bell measurement, i.e., the probabilities ((7-1)) for eigenvalues $m_z$ of the encoded Z operator $Z_L$ with respect to the first qubit in the Bell state and eigenvalues $m_x$ of the encoded X operator $X_L$ with respect to the input state, by using the measurement values ((7-2)) input from the $M_z$ measurement value input unit 201 to the probability calculation unit 204, the measurement values ((7-3)) input from the $M_x$ measurement value input unit 202 to the probability calculation unit 204, and the error probabilities ((7-4)) input from the error probability holding unit 203 to the probability calculation unit 204.

$$P(m_z, m_x) \tag{7-1}$$

$$\vec{m_z} \tag{7-2}$$

$$\vec{m_x} \tag{7-3}$$

$$P^{(0)}(\vec{e_z}, \vec{e_x}) \tag{7-4}$$

Because the above-described transversality exists, it is in many cases possible to represent the error probabilities ((7-4)) by the product of the error probabilities ((9-1)) (j is an integer of 1 to n) of n bit pairs, as indicated by equation (8-1) below.

$$P^{(0)}(\vec{e_z}, \vec{e_x}) = \prod_{j=1}^{n} P_j^{(0)}(e_{zj}, e_{xj}) \tag{8-1}$$

$$P_j^{(0)}(e_{zj}, e_{xj}) \tag{9-1}$$

It should be noted that an error $e_{zj}$ for $m_{zj}$ and an error $e_{xj}$ for $m_{xj}$ are correlated because of the physical controlled-NOT gate, and this correlation is taken into consideration by the error probability ((9-1)).

First, the relative probabilities ((11-1)) are calculated by equation (10-1) below.

$$R(m_z, m_x) = \sum_{(\vec{l_z}, \vec{l_x})} P^{(0)}(\vec{l_z} + \vec{m_z}, \vec{l_x} + \vec{m_x}) \tag{10-1}$$

$$R(m_z, m_x) \tag{11-1}$$

The sum ((12-1)) is taken for ((12-2)) that satisfies conditions 1 to 4 below.

$$\sum_{(\vec{l_z}, \vec{l_x})} \tag{12-1}$$

$$(\vec{l_z}, \vec{l_x}) \tag{12-2}$$

Condition 1: ((13-1)) holds for all the Z stabilizer generators $S_z$.
Condition 2: ((13-2)) holds for all the X stabilizer generators $S_x$.
Condition 3: ((13-3)) holds for the encoded Z operator $Z_L$.
Condition 4: ((13-4)) holds for the encoded X operator $X_L$.

$$S_z \vec{l_z} = 0 \tag{13-1}$$

$$S_x \vec{l_x} = 0 \tag{13-2}$$

$$Z_L \vec{l_z} = m_z \tag{13-3}$$

$$X_L \vec{l_x} = m_x \tag{13-4}$$

The above matrix operation is a normal binary operation. (The eigenvalue $m_x$ of the encoded Z operator $Z_L$ and the eigenvalue $m_x$ of the encoded X operator $X_L$ are also binary values. That is, an eigenvalue of 1 is represented by a binary value of 0, and an eigenvalue of −1 is represented by a binary value of 1.).

((12-2)) has a total of 2n variables, and they have $2^{2n}$ patterns. Since, however, the total number of above-mentioned conditions is $(n_z+n_x+1+1)=(n+1)$ (when using relation $n=n_z+n_x+1$), ((12-1)) can independently take (n−1) variables, and they have $2^{n-1}$ patterns fewer than $2^{2n}$ patterns.

By taking account of this in the calculation of the probability calculation unit 204, ((12-1)) is executed by moving (n−1) variables of ((12-2)) as independent variables, and determining (n+1) remaining variables in accordance with conditions 1 to 4 described above.

The above-mentioned subroutine executed by the probability calculation unit 204 will be explained below with reference to FIG. 4. FIG. 4 is a flowchart of the subroutine performed by the probability calculation unit of the decoding apparatus according to the first embodiment when using the Z·X separation type stabilizer code.

Initial values $R(m_z,m_x)$ (i=0) for taking the sum of the relative probabilities ((10-1)) are set to zero (step S401). i takes $2^{n-1}$ values as the number of patterns of the variables which ((12-1)) can independently take.

i is increased by 1 (step S402).

Whether i is $2^{n-1}$ or less is determined. If i is $2^{n-1}$ or less, the process advances to step S404. If i is not $2^{n-1}$ or less, it is determined that the relative probability calculation is complete (step S403).

Of all components $l_z[j]$ and $l_x[j]$ (j=1, . . . , n) of two vectors contained ((12-2)), each bit of i is substituted into (n−1) components (step S404).

Of all the components $l_z[j]$ and $l_x[j]$, (n+1) remaining components are determined in accordance with above-mentioned conditions 1 to 4 (step S405).

By using all the components $l_z[j]$ and $l_x[j]$ calculated in steps S404 and S405, one term of the sum of the right-hand side of equation (10-1) above is calculated (step S406). The result is added to the value calculated for i last time, thereby finally obtaining the sum of the right-hand side of equation (10-1) above.

Steps S402 to S406 are repeated immediately before i exceeds $2^{n-1}$.

Finally, ((7-1)) is obtained by normalizing the relative probability ((11-1)) as follows.

$$P(m_z, m_x) = \frac{R(m_z, m_x)}{\sum_{(m'_z, m'_x)} R(m'_z, m'_x)} \quad (14\text{-}1)$$

Figure 5:
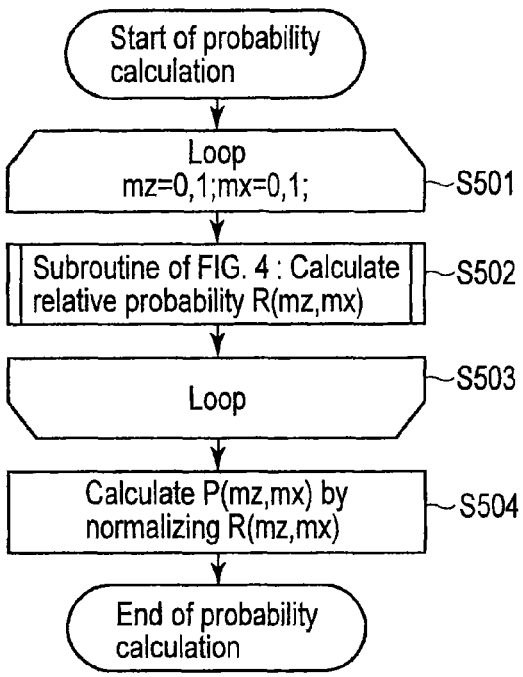
FIG. 5 is a flowchart indicating an operation including FIG. 4 of the probability calculation unit of the decoding apparatus according to the first embodiment.

The above operation of the probability calculation unit 204 will be explained with reference to FIG. 5. FIG. 5 is a flowchart showing the operation of the probability calculation unit of the decoding apparatus according to the first embodiment when using the Z·X separation type stabilizer code.

Since each of $m_z$ and $m_x$ takes a value of 0 or 1, summation performed in the denominator of the right-hand side of equation (14-1) can take four patterns. Steps S501 to S503 are repeated for these four patterns.

In step S502, the subroutine shown in FIG. 4 is performed on the values of $m_z$ and $m_x$, thereby obtaining ((11-1)).

After the loop from step S501 to step S503 is complete, ((7-1)) is obtained by calculating the right-hand side of equation (14-1) in accordance with ((11-1)) calculated by this loop.

The stabilizer code probability calculation described above becomes inefficient when the size of the code increases. Therefore, a practical example where efficient calculations are possible will be explained in detail below. (The operation of the probability calculation unit 204 herein explained naturally similarly applies to the second embodiment, and almost similarly applies to a probability calculation unit 1004 of the third and fourth embodiments to be described later.)

Assume that a quantum error correction code is a concatenated code formed by concatenating Z·X separation type stabilizer codes (see M. A. Nielsen and I. L. Chuang, Quantum Information and Computation, Cambridge Univ. Press [2000], Chapter 10, pp. 425-499). (Many such codes exist. Typical examples are a concatenated code of Steane's 7-qubit codes and a $C_4/C_6$ code to be described later. See E. Knill, Nature 434, 39 [2005].) A calculation herein explained is an efficient calculation when codes at individual levels forming a concatenated code are small. For the sake of simplicity, a concatenated code obtained by concatenating, to level L, identical stabilizer codes for encoding one qubit by n qubits will be explained. However, it is also possible to use stabilizer codes for encoding two or more qubits, or use different stabilizer codes at different levels.

Assume that the error probability input from the error probability holding unit 203 to the probability calculation unit 204 is independent for each block at level 1, and the error probability in a block $b_1$ ($b_1$=1, 2, . . . , $n^{L-1}$) at level 1 is represented by ((15-1)).

$$P_{b_1}^{(0)}(\vec{e}_z, \vec{e}_x) \quad (15\text{-}1)$$

It should be noted that the correlation between the error probability in the block $b_1$ at level 1 of the first qubit in the Bell state and that of the block $b_1$ at level 1 in the input state is taken into consideration.

Because the above-described transversality exists, it is in many cases possible to represent the error probability ((15-1)) by the product of the error probabilities of n bit pairs forming the block $b_1$ at level 1.

The probability calculation unit 204 calculates the probabilities ((16-1)) for the measurement values of encoded Bell measurement, i.e., the probabilities ((16-1)) for the eigenvalues $m_z$ of the encoded Z operator at level L with respect to the first qubit in the Bell state and the eigenvalues $m_x$ of the encoded X operator at level L with respect to the input state, by using measurement values ((7-2)) input from the $M_z$ measurement value input unit 201 to the probability calculation unit 204, the measurement values ((7-3)) input from the $M_x$ measurement value input unit 202 to the probability calculation unit 204, and the above-mentioned error probabilities ((15-1)) input from the error probability holding unit 203 to the probability calculation unit 204.

$$P^{(L)}(m_z, m_x) \quad (16\text{-}1)$$

First, the probabilities ((17-1)) for the eigenvalues $m_z$ of the encoded Z operator at level 1 and the eigenvalues $m_x$ of the encoded X operator at level 1 are calculated for the first qubit in the Bell state and each block $b_1$ at level 1 in the input state by using the above-described calculation method shown in FIGS. 4 and 5.

$$P_{b_1}^{(1)}(m_z, m_x) \quad (17\text{-}1)$$

Then, the probabilities ((18-1)) for the eigenvalues $m_2$ of the encoded Z operator at level 2 and the eigenvalues $m_x$ of the encoded X operator at level 2 are calculated for the first qubit in the Bell state and each block $b_2$ ($b_2$=1, 2, . . . , $n^{L-2}$) at level 2 in the input state as follows by using ((17-1)). $b_1$ and $b_2$ have the following relationship: $b_1=n(b_2-1)+d$ (d=1, 2, . . . , n).

$$P_{b_2}^{(2)}(m_z, m_x) \quad (18\text{-}1)$$

First, the relative probabilities ((19-2)) are calculated by equation (19-1) below.

$$R^{(2)}_{b_2}(m_z, m_x) = \sum_{m^{(1)}_z, m^{(1)}_x} \cdots \sum_{m^{(n)}_z, m^{(n)}_x} \prod_{d=1}^{n} P^{(1)}_{n(b_2-1)+d}(m^{(d)}_z, m^{(d)}_x) \quad (19\text{-}1)$$

$$R^{(2)}_{b_2}(m_z, m_x) \quad (19\text{-}2)$$

In this case, the sum ((20-1)) is taken for ((20-2)) satisfying conditions 5 to 8 below.

$$\sum_{m^{(1)}_z, m^{(1)}_x} \cdots \sum_{m^{(n)}_z, m^{(n)}_x} \quad (20\text{-}1)$$

$$m^{(1)}_z, m^{(1)}_x, \ldots, m^{(n)}_z, m^{(n)}_x \quad (20\text{-}2)$$

Condition 5: ((21-1)) holds for all Z stabilizer generators $S_Z$ at level 2.
Condition 6: ((21-2)) holds for all X stabilizer generators $S_X$ at level 2.
Condition 7: ((21-3)) holds for the encoded Z operator $Z_L$ at level 2.
Condition 8: ((21-4)) holds for the encoded X operator $X_L$ at level 2.

$$S_Z \vec{m_z} = 0 \quad (21\text{-}1)$$

$$S_X \vec{m_x} = 0 \quad (21\text{-}2)$$

$$Z_L \vec{m_z} = m_z \quad (21\text{-}3)$$

$$X_L \vec{m_x} = m_x \quad (21\text{-}4)$$

In this case, ((22-1)) and ((22-2)) hold.

$$\vec{m_z} = \begin{pmatrix} m^{(1)}_z \\ \vdots \\ m^{(n)}_z \end{pmatrix} \quad (22\text{-}1)$$

$$\vec{m_x} = \begin{pmatrix} m^{(1)}_x \\ \vdots \\ m^{(n)}_x \end{pmatrix} \quad (22\text{-}2)$$

((20-1)) is executed by moving (n−1) variables of 2n variables of ((23-1)) as independent variables, and determining (n+1) remaining variables in accordance with above-mentioned conditions 5 to 8.

Subroutine 1 described above will be explained below with reference to FIG. 6. FIG. 6 is a flowchart of subroutine 1 of the probability calculation unit of the decoding apparatus according to the first embodiment when using a concatenated code obtained by concatenating Z·X separation type stabilizer codes.

Initial values $R_{b_2}(m_z, m_x)$ (i=0) for taking the sum of the probabilities ((19-1)) are set to zero (step S601). i takes $2^{n-1}$ values equal to the number of patterns of variables which ((23-1)) can independently take.

After steps S402 and S403, of all components $m_z^{(d)}$ and $m_x^{(d)}$ (to be also referred to as $m_z[d]$ and $m_x[d]$ hereinafter) (d=1, . . . , n) of two vectors contained in ((23-1)), each bit of i is substituted into (n−1) components (step S604).

Of all the components $m_z^{(d)}$ and $m_x^{(d)}$, (n+1) remaining components are determined in accordance with above-mentioned conditions 5 to 8 (step S605).

$P_0$ is set to 1 (step S606).

Since d can take n values from 1 to n, steps S607 to S610 are repeated by using each value of d.

In step S608, multiplication is performed by calculating $P^{(1)}_{n(b2-1)+d}(m_z^{(d)}, m_x^{(d)})$ on the right-hand side of (19-1) (step S608).

The values obtained in step S608 are added (step S609).

The calculation is advanced based on the value calculated for i last time, thereby finally obtaining the right-hand side of equation (19-1) above.

Steps S402, S403, and S604 to S610 are repeated immediately before i exceeds $2^{n-1}$.

$$(\vec{m_z}, \vec{m_x}) \quad (23\text{-}1)$$

Then, ((24-2)) is obtained by normalizing the relative probability ((19-2)) as indicated by the following equation.

$$P^{(2)}_{b_2}(m_z, m_x) = \frac{R^{(2)}_{b_2}(m_z, m_x)}{\sum_{(m'_z, m'_x)} R^{(2)}_{b_2}(m'_z, m'_x)} \quad (24\text{-}1)$$

$$P^{(2)}_{b_2}(m_z, m_x) \quad (24\text{-}2)$$

Figure 7:
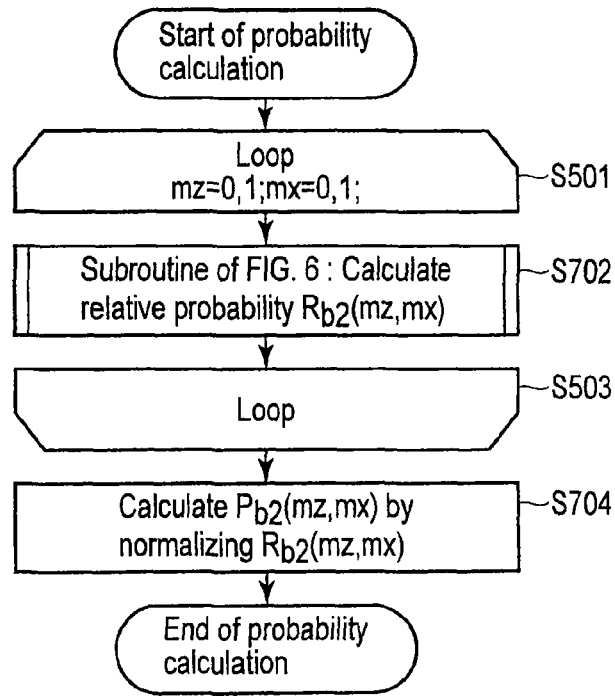
FIG. 7 is a flowchart of subroutine 2 including FIG. 6 of the probability calculation unit of the decoding apparatus according to the first embodiment.

Subroutine 2 above will be explained below with reference to FIG. 7. FIG. 7 is a flowchart of subroutine 2 of the probability calculation unit of the decoding apparatus according to the first embodiment when using a concatenated code obtained by concatenating Z·X separation type stability codes.

Since each of $m_z$ and $m_x$ takes a value of 0 or 1, summation performed by the denominator of the right-hand side of equation (24-1) can take four patterns. Steps S501, S702, and S503 are repeated for these four patterns.

In step S702, ((24-2)) is obtained by performing the subroutine shown in FIG. 6 on the values of $m_z$ and $m_x$.

After the loop of steps S501, S702, and S503 is complete, the right-hand side of equation (24-1) is calculated by ((24-2)) calculated by this loop, thereby obtaining ((24-2)).

By using subroutine 2 described above, the probabilities ((25-1)) for the eigenvalues $m_z$ of the encoded Z operator at level 3 and the eigenvalues $m_x$ of the encoded X operator at level 3 can be calculated by using ((24-2)) with respect to the first qubit in the Bell state and each block $b_3$ ($b_3$=1, 2, . . . , $n^{L-3}$) at level 3 in the input state. (Note that ((17-1)) shown in FIG. 6 is replaced with ((24-2)).) ((16-1)) can be calculated by continuing the same calculation to level L.

$$P^{(3)}_{b_3}(m_z, m_x) \quad (25\text{-}1)$$

Figure 8:
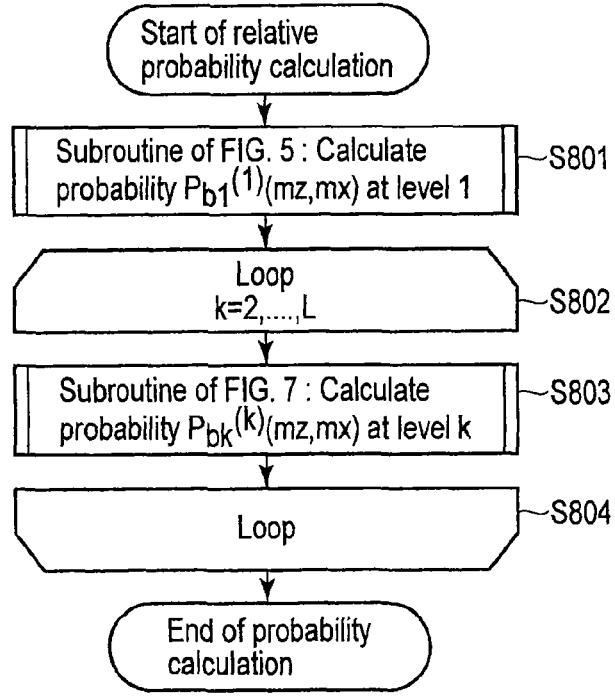
FIG. 8 is a flowchart indicating an operation including FIGS. 5 and 7 of the probability calculation unit of the decoding apparatus according to the first embodiment.

The above-described operation of the probability calculation unit 204 will be explained below with reference to FIG. 8. FIG. 8 is a flowchart showing the operation of the probability calculation unit of the decoding apparatus according to the first embodiment when using a concatenated code obtained by concatenating Z·X separation type stabilizer codes.

In accordance with the subroutine shown in FIG. 5, the probabilities ((17-1)) for the eigenvalues $m_z$ of the encoded Z operator at level 1 and the eigenvalues $m_x$ of the encoded X operator at level 1 are calculated with respect to the first qubit in the Bell state and each block $b_1$ at level 1 in the input state by using the above-described calculation method shown in FIGS. 4 and 5 (step S801).

The probabilities from level 1 to level L are calculated in the same manner as when the probabilities at level 2 ((24-2)) are calculated from the probabilities at level 1 ((17-1)) in FIG. 7. After the probabilities of level k are calculated by the subroutine shown in FIG. 7, k is moved from 2 to L, and calculations are performed by a loop from step S802 to step S804.

In the first embodiment described above, the measurement results of two encoded qubits are simultaneously processed, and a measurement result is estimated and determined by soft-decision decoding based on probabilistic inference. When compared to the conventional methods, therefore, it is possible to remarkably improve the decoding performance of encoded Bell measurement used in error-correcting teleportation or in an encoded controlled-NOT gate. Consequently, the performance of fault-tolerant quantum computation can be improved.

(Second Embodiment)

Next, a decoding apparatus according to the second embodiment will be explained. FIG. 9 shows the decoding apparatus of this embodiment, and the apparatus includes an $M_z$ measurement value input unit 201, $M_x$ measurement value input unit 202, error probability holding unit 203, probability calculation unit 204, and decision unit 901. Note that the same reference numbers as in FIG. 2 denote components having the same functions in FIG. 9, a detailed explanation thereof will be omitted, and different parts will mainly be explained below.

The decoding apparatus of the second embodiment can perform not only error correction but also error detection, and this feature is obtained by the decision unit 901.

The decision unit 901 first detects a maximum one of probabilities input from the probability calculation unit 204. Then, the decision unit 901 compares the detected maximum probability with a probability $p_{det}$ (to be called "an error detection determination probability" hereinafter) that is held in advance or externally input and held. If the maximum value of the probabilities is higher than the error detection determination probability $p_{det}$, the decision unit 901 outputs corresponding measurement values, and terminates the decoding process. On the other hand, if the maximum value of the probabilities is not higher than the error detection determination probability $p_{det}$, the decision unit 901 decides that an error is detected, outputs a value notifying this, and terminates the decoding process.

Note that if the set value of the error detection determination probability $p_{det}$ is too low, the performance may be inferior to that of error detection using hard-decision decoding, so it is necessary to carefully set $p_{det}$. (See examples to be described later.)

The second embodiment described above can achieve the same effect as that of the first embodiment, and can also perform error detection by comparing the detected maximum probability with the error detection determination probability.

(Third Embodiment)

A decoding apparatus according to the third embodiment will be explained below. FIG. 10 shows the arrangement of the decoding apparatus, and the apparatus includes an $M_z$ measurement value input unit 1001, $M_x$ measurement value input unit 1002, error probability holding unit 1003, probability calculation unit 1004, and decision unit 205. Note that the same reference numbers as in FIG. 2 denote components having the same functions in FIG. 10, a detailed explanation thereof will be omitted, and different parts will mainly be explained below.

The decoding apparatus of the third embodiment is a decoding apparatus capable of performing a decoding process when errors include an erasure error and probabilistic gate error. This feature is obtained by the $M_z$ measurement value input unit 1001, $M_x$ measurement value input unit 1002, error probability holding unit 1003, and probability calculation unit 1004.

The erasure error is an error by which whether there is an error in each physical qubit is known beforehand. On the other hand, the probabilistic gate error is an error caused by a gate (probabilistic gate) by which whether the gate is successful or unsuccessful is known beforehand when executing the gate. If the gate is unsuccessful, the probabilistic error can be processed in the same manner as that for the erasure error by regarding that there is an erasure error in the physical qubit on which the gate is executed. Accordingly, only the erasure error will be explained below.

The $M_z$ measurement value input unit 1001 and $M_x$ measurement value input unit 1002 respectively receive the measurement values of $M_z$ and $M_x$. If there is an erasure error, however, a value notifying the error is input.

The $M_z$ measurement value input unit 1001 and $M_x$ measurement value input unit 1002 output these values not only to the probability calculation unit 1004 but also to the error probability holding unit 1003.

The error probability holding unit 1003 updates the error probabilities based on the erasure error information input from the $M_z$ measurement value input unit 1001 and $M_x$ measurement value input unit 1002, and outputs the updated error probabilities to the probability calculation unit 1004.

A standard method of updating the error probabilities is a method of replacing erased qubits with the average. Assume that two qubits exist, and $P(e_{z1}, e_{z2}, e_{x1}, e_{x2})$ is prestored as the error probability. If a first bit is erased, the error probability is updated as follows.

$$P'(0, e_{z2}, 0, e_{x2}) = P'(0, e_{z2}, 1, e_{x2})$$
$$= P'(1, e_{z2}, 0, e_{x2})$$
$$= P'(1, e_{z2}, 1, e_{x2})$$
$$= \frac{(P(0, e_{z2}, 0, e_{x2}) + P(0, e_{z2}, 1, e_{x2}) + P(1, e_{z2}, 0, e_{x2}) + P(1, e_{z2}, 1, e_{x2}))}{4}$$

The probability calculation unit 1004 calculates the probabilities for the measurement values of Bell measurement, i.e., for the eigenvalues of an encoded Z operator with respect to the first qubit in the Bell state and the eigenvalues of an encoded X operator with respect to the input state, by using the measurement values and erasure error information input from the $M_z$ measurement value input unit 1001 and $M_x$ measurement value input unit 1002, the error probabilities input from the error probability holding unit 1003, and quantum error correction code information that is held in advance or externally input and held, and outputs the calculated probabilities to the decision unit 205.

The operation of the probability calculation unit 1004 is almost the same as that of the probability calculation unit 204 of the above-described first embodiment. If there is an erasure error, however, there is no measurement value ((26-1)) for a bit having the erasure error (((26-2)) and ((26-3)) have a correlation in a physical controlled-NOT gate, so the erasure error is processed by this bit pair), so the calculation of ((26-4)) seems to be impossible.

$$(m_{zj}, m_{xj}) \quad (26\text{-}1)$$

$$m_{zj} \quad (26\text{-}2)$$

$$m_{xj} \quad (26\text{-}3)$$

$$R(m_z, m_x) = \sum_{(\vec{l}_z, \vec{l}_x)} P^{(0)}(\vec{l}_z + \vec{m}_z, \vec{l}_x + \vec{m}_x) \quad (26\text{-}4)$$

When using the above-described standard method of updating the error probabilities, however, ((27-1)) is independent of the values of ((26-1)), so ((26-1)) need only be calculated as an appropriate value (for example, ((27-2))).

$$P^{(0)}(\vec{l}_z + \vec{m}_z, \vec{l}_x + \vec{m}_x) \quad (27\text{-}1)$$

$$(m_{zj}, m_{xj}) = (0, 0) \quad (27\text{-}2)$$

FIG. 11 shows results indicating that the performance of the above decoding method is higher than that of the conventional hard-decision decoding method. Referring to FIG. 11, thresholds for a communication channel having both an erasure error and normal undetectable error are calculated by simulation. A Knill's $C_4/C_6$ code was used as the code (see examples). Although the $C_4/C_6$ code has two encoded qubits, one of them is used in this embodiment. The sum of encoded qubits not used in probability calculations is calculated, and the probability for encoded qubits used in probability calculations is calculated (this applies to the following examples). The probability at which a normal undetectable error occurs under the condition that no erasure error has occurred will be called a "conditional error probability". Each plot in the graph of FIG. 11 represents the threshold of this conditional error probability with respect to a given erasure error probability (i.e., the upper limit of the conditional error probability at which the decoding error probability decreases when the level of a concatenated code is increased). The solid circles indicate a result obtained when using the soft-decision decoding method of this embodiment, and the solid squares indicate a result obtained when using the conventional hard-decision decoding method. FIG. 11 reveals that the method of this embodiment has performance much higher than that of the conventional method. The threshold is about 19% when the erasure error probability is zero, and this value matches the theoretical limit known as a hashing bound. Also, the threshold is zero when the erasure error probability is 50%, and this value matches the theoretical limit of an erasure error.

The third embodiment described above can achieve the same effect as that of the first embodiment. In addition, even when errors include an erasure error and probabilistic gate error, it is possible to update the error probability based on erasure error information, and obtain the measurement values of Bell measurement by using the standard method of updating the error probabilities.

(Fourth Embodiment)

Figure 12:
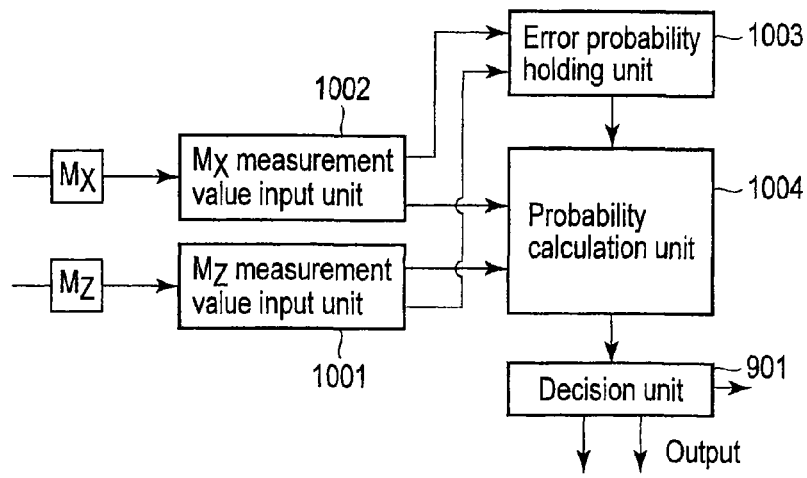
FIG. 12 is a view showing a decoding apparatus according to the fourth embodiment.

A decoding apparatus according to the fourth embodiment will be explained below. FIG. 12 shows the arrangement of the decoding apparatus, and the apparatus includes an $M_z$ measurement value input unit 1001, $M_x$ measurement value input unit 1002, error probability holding unit 1003, probability calculation unit 1004, and decision unit 901. Note that the same reference numbers as in FIGS. 9 and 10 denote components having the same functions in FIG. 12, a detailed explanation thereof will be omitted, and different parts will mainly be explained below.

The decoding apparatus of the fourth embodiment is a decoding apparatus capable of performing not only error correction but also error detection when errors include an erasure error and probabilistic gate error. This feature is obtained by combining the $M_z$ measurement value input unit 1001, $M_x$ measurement value input unit 1002, error probability holding unit 1003, and probability calculation unit 1004 of the decoding apparatus of the third embodiment, and the decision unit 901 of the decoding apparatus of the second embodiment.

The decision unit 901 first receives probabilities calculated by the probability calculation unit 1004 by taking account of erasure error information, and detects a maximum one of the probabilities. Then, the decision unit 901 compares the maximum probability with an error detection determination probability $p_{det}$ that is held in advance or externally input and held. If the maximum value of the probabilities is higher than the error detection determination probability $p_{det}$, the decision unit 901 outputs corresponding measurement values, and terminates the decoding process. On the other hand, if the maximum value of the probabilities is not higher than the error detection determination probability $p_{det}$, the decision unit 901 decides that an error is detected, outputs a value notifying this, and terminates the decoding process.

The decoding apparatus of the fourth embodiment is very useful in state preparations when an erasure error or probabilistic gate error exists (see examples).

The fourth embodiment described above can simultaneously achieve the effects of the second and third embodiments.

(Fifth Embodiment)

Figure 13:
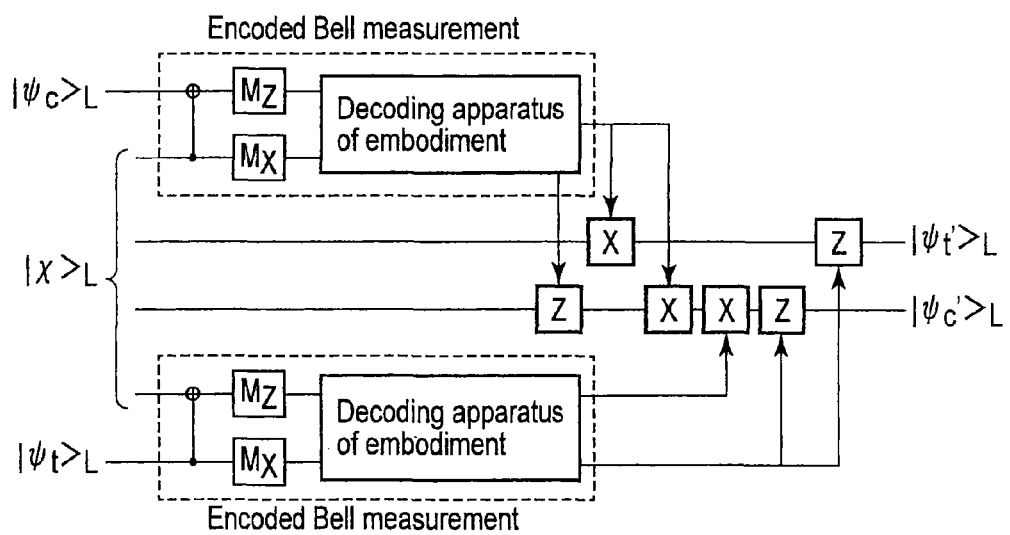
FIG. 13 is a view showing an encoding controlled-NOT gate including a decoding apparatus according to the fifth embodiment.

Next, an encoded controlled-NOT gate according to the fifth embodiment will be explained. The decoding apparatus according to the embodiment is applied to this encoded controlled-NOT gate. FIG. 13 shows the arrangement of the gate.

This encoded controlled-NOT gate using ((28-1)) is already known (see Hayato Goto and Koichi Ichimura, Japanese Patent No. 4786727, and H. Goto and K. Ichimura, Phys. Rev. A 80, 040303(R) [2009]). The performance of this encoded controlled-NOT gate can dramatically be improved by using the decoding apparatus of the embodiment in encoded Bell measurement performed by the gate (see examples).

$$|\chi\rangle_L \quad (28\text{-}1)$$

Note that an entangled state ((28-1)) including four encoded qubits is defined by equation (29-1) below.

$$|\chi\rangle_L = |0\rangle_L |0\rangle_L |0\rangle_L |0\rangle_L + |0\rangle_L |0\rangle_L |1\rangle_L |1\rangle_L + |1\rangle_L |1\rangle_L |0\rangle_L |0\rangle_L$$
$$|0\rangle_L |1\rangle_L |1\rangle_L + |1\rangle_L |1\rangle_L |1\rangle_L |0\rangle_L \quad (29\text{-}1)$$

The fifth embodiment described above can dramatically improve the performance of an encoded controlled-NOT gate by applying the decoding apparatus according to one of the first to fourth embodiments to the encoded controlled-NOT gate.

EXAMPLES

Examples will now be explained.

Since a $C_4/C_6$ code (see E. Knill, Nature 434, 39 [2005]) was used as a quantum error correction code in all examples below, the $C_4/C_6$ code is explained first.

The $C_4/C_6$ code is a $C_4$ code at level 1, and is a concatenated code using a $C_6$ code at level 2 or higher.

The $C_4$ code is a Z·X separation type stabilizer code that encodes two qubits by four qubits. A Z stabilizer generator is ZZZZ, and an X stabilizer generator is XXXX. Also, encoded Z gates are ZIZI and IIZZ, and encoded X gates are XXII and IXIX. (Two pairs exist in order to encode two qubits.)

The $C_6$ code is a Z·X separation type stabilizer code that encodes two qubits by six qubits. Z stabilizer generators are ZIIZZZ and ZZZIIZ, and X stabilizer generators are XIIXXX and XXXIIX. Also, encoded Z gates are IIZZIZ and IIIZZI, and encoded X gates are IXXIII and XIXXII. (Two pairs exist in order to encode two qubits.)

As is apparent from the above description, the $C_4/C_6$ code is a concatenated code obtained by concatenating Z·X separation type stabilizer codes, and the efficient probability calculation algorithms shown in FIGS. 5 to 9 are applicable. In all examples below, a calculation program of a probability calculation unit is based on the algorithms shown in FIGS. 5 to 9.

In addition, in all examples below, as the error probability of an error probability holding unit, the error probability ((30-2)) for an error $e_{zj}$ for a measurement value $m_{zj}$ and an error $e_{xj}$ for a measurement value $m_{xj}$ is set as follows for all bit pairs j.

$$P_j^{(0)}(e_{zj}, e_{xj}) = \begin{cases} 0.81 & \ldots e_{zj} = e_{xj} = 0 \\ 0.19/3 & \ldots \text{if not } e_{zj} = e_{xj} = 0 \end{cases} \quad (30\text{-}1)$$

$$P_j^{(0)}(e_{zj}, e_{xj}) \quad (30\text{-}2)$$

The present inventors confirmed by simulation that even when a fixed value is thus set, the value is effective for actual various error probabilities. That is, the decoding method of the embodiment is robust for the way of setting ((30-2)). This is an important feature because it is difficult to accurately estimate an error probability by fault-tolerant quantum computation. It should be noted that the correlation between $e_{zj}$ and $e_{xj}$ is taken into consideration.

In all examples below, encoded controlled-NOT gates are evaluated by computer simulation.

In the first and second examples processing normal error models, physical controlled-NOT gates are transversally executed in accordance with E. Knill, Nature 434, 39 (2005), and two error-correcting teleportations are performed. The decoding apparatus of the embodiment is used in the error-correcting teleportations.

Also, in the third and fourth examples processing probabilistic gate models, encoded controlled-NOT gates using ((28-1)) are performed in accordance with H. Goto and K. Ichimura, Phys. Rev. A 80, 040303(R) (2009). In these examples, the encoded controlled-NOT gates of the fifth embodiment are used.

The first and second examples used a state preparation method complying with E. Knill, Nature 434, 39 (2005), and the third and fourth examples used a state preparation method complying with H. Goto and K. Ichimura, Phys. Rev. A 80, 040303(R) (2009).

In the above-described state preparations, error detection and post selection based on the error detection are performed. Since the method changed from one example to another, these methods will be explained below.

First Example

In this example, to perform an encoded controlled-NOT gate, a physical controlled-NOT gate is first transversally executed, and then error-correcting teleportation is executed on each of two encoded qubits. The decoding apparatus of the first embodiment is used in these processes.

First, an error model used in this example will be explained. Assuming that an error existed in only a physical controlled-NOT gate, a standard model called a depolarizing model is used (see E. Knill, Nature 434, 39 [2005]). Let $p_e$ be the error probability of the model.

In the state preparations, error detection and post selection based on the error detection are performed. In this example, the error detection in the state preparations is performed using only conventional hard-decision decoding error correction (see E. Knill, Nature 434, 39 [2005]).

FIG. 14 shows simulation results comparing the performance (the hollow circles) when using the decoding apparatus (FIG. 3) of the first embodiment with the performance (the x-marks) when using a conventional hard-decision decoding apparatus. Note that $p_e$ is set to 0.01.

As shown in FIG. 14, the error probability of the method of the embodiment is lower by two orders of magnitude than that of the conventional method at level 4. On the other hand, the resources (the numbers of times of the physical controlled-NOT gate) are the same.

As described above, when using the decoding apparatus (FIG. 2) of the first embodiment instead of the conventional hard-decision decoding apparatus, the performance of an encoded controlled-NOT gate and hence the performance of fault-tolerant quantum computation dramatically improved.

Second Example

In this example, the decoding apparatus (FIG. 9) of the second embodiment is applied to error detection in the state preparations at level 4 in the first example. (Until level 3, the performance of hard-decision decoding error detection is almost the same as that of optimal soft-decision decoding, so hard-decision decoding requiring a small calculation amount is used.) An error model used in this example is the same as that used in the first example.

The error detection determination probability $p_{det}$ is set to 0.997.

The state preparations require not only error detection in encoded Bell measurement, but also decoding and error detection on only the measurement value of $M_z$ and decoding and error detection on only the measurement value of $M_x$. In this example, soft-decision decoding was used in these processes as well. A decoding apparatus for only the Ma measurement value is obtained by changing the decoding apparatus of the second embodiment such that the $M_z$ measurement value input unit 201 alone is used as an input unit, the error probability is changed to an error probability ((31-1)) for the measurement value $m_{zj}$, and variables to be used in the calculation of the probability calculation unit are changed to only variables concerning Z. This similarly applies to a decoding apparatus for only the $M_x$ measurement value.

$$P_j^{(0)}(e_{zj}) \quad (31\text{-}1)$$

An error detection determination probability $p'_{det}$ of the decoding apparatus for only the $M_z$ measurement value and the decoding apparatus for only the $M_x$ measurement value is set to 0.995.

When $p_e=1\%$, the error probability of the encoded controlled-NOT gate (at level 4) of this example is about 0.0002%. This is half or less an error probability of 0.00045% (see FIG. 14) of the encoded controlled-NOT gate of the first example. On the other hand, the resources (the numbers of times of the physical controlled-NOT gate) are almost the same.

As described above, when using the decoding apparatus of the second embodiment shown in FIG. 9 in error detection performed in the state preparations, the performance of the encoded controlled-NOT gate and hence the performance of fault-tolerant quantum computation further improved.

Third Example

In this example, the decoding apparatus of the third embodiment is applied to the encoded controlled-NOT gate of the fifth embodiment.

First, an error model used in this example will be explained. Assuming that an error exists in only a physical controlled-NOT gate, and a probabilistic gate model is used as the model (see Hayato Goto and Koichi Ichimura, Japanese Patent No. 4786727, and H. Goto and K. Ichimura, Phys. Rev. A 80, 040303(R) [2009]). In this error model, whether the physical controlled-NOT gate is successful or unsuccessful is known when it is executed. Let $p_F$ be this failure probability. If the physical controlled-NOT gate is unsuccessful, it is determined that two physical qubits on which the gate has been executed have an error, and the error is regarded as an erasure error. If the physical controlled-NOT gate is successful, a depolarizing error occurs at a conditional error probability $p_c$.

In this example, error detection in the state preparations is performed using only conventional hard-decision decoding error detection (see Hayato Goto and Koichi Ichimura, Japanese Patent No. 4786727, and H. Goto and K. Ichimura, Phys. Rev. A 80, 040303(R) [2009]).

Simulation is performed under the conditions that $p_F=0.05$ and $p_c=0.004$. FIG. 15 shows the results. The hollow circles indicate the result when using the decoding apparatus (FIG. 10) of the third embodiment. The x-marks indicate the result when using the conventional hard-decision decoding apparatus.

At levels 3 and 4, the error probability of the method of the third embodiment is about ⅓ that of the conventional method. On the other hand, the resources (the numbers of times of the physical controlled-NOT gate) are the same.

As described above, since the decoding apparatus (FIG. 10) of the third embodiment is used instead of the conventional hard-decision decoding apparatus, the performance of the encoded controlled-NOT gate when using the probabilistic gate and hence the performance of fault-tolerant quantum computation when using the probabilistic gate dramatically improved.

Fourth Example

In this example, the decoding apparatus (FIG. 12) of the fourth embodiment is applied to error detection in the state preparations at levels 3 and 4 in the third example.

An error model used in this example is the same as that of the third example.

An error detection determination probability $p_{det}$ is set to 0.99 at level 3, and to 0.997 at level 4. Also, an error detection determination probability $p'_{det}$ of a decoding apparatus for $M_z$ measurement values alone and a decoding apparatus for $M_x$ measurement values alone is set to 0.9 at level 3, and to 0.97 at level 4.

Simulation was performed under the conditions that $p_F=0.05$ and $p_c=0.004$. FIG. 16 shows the results. The hollow squares indicate the result of this example, and the hollow circles indicate the result of the first example. At level 4, the error probability of this example is lower by nearly one order of magnitude than that of the third example. On the other hand, the resources (the numbers of times of the physical controlled-NOT gate) are almost the same.

As described above, since the decoding apparatus (FIG. 12) of the fourth embodiment is used in error detection performed in the state preparations, the performance of the encoded controlled-NOT gate when using the probabilistic gate and hence the performance of fault-tolerant quantum computation when using the probabilistic gate further improved.

The flow charts of the embodiments illustrate methods and systems according to the embodiments. It will be understood that each block of the flowchart illustrations, and combinations of blocks in the flowchart illustrations, can be implemented by computer program instructions. These computer program instructions may be loaded onto a computer or other programmable apparatus to produce a machine, such that the instructions which execute on the computer or other programmable apparatus create means for implementing the functions specified in the flowchart block or blocks. These computer program instructions may also be stored in a computer-readable memory that can direct a computer or other programmable apparatus to function in a particular manner, such that the instruction stored in the computer-readable memory produce an article of manufacture including instruction means which implement the function specified in the flowchart block or blocks. The computer program instructions may also be loaded onto a computer or other programmable apparatus to cause a series of operational steps to be performed on the computer or other programmable apparatus to produce a computer programmable apparatus which provides steps for implementing the functions specified in the flowchart block or blocks.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A decoding apparatus for use in encoded Bell measurement for two encoded qubits, comprising:
   a first acquisition unit configured to acquire first measurement values of measurements performed to measure an eigenvalue of an encoded Z operator with respect to a first encoded qubit of the two encoded qubits;
   a second acquisition unit configured to acquire second measurement values of measurements performed to measure an eigenvalue of an encoded X operator with respect to a second encoded qubit of the two encoded qubits;
   a holding unit configured to hold error probabilities for the first measurement values and the second measurement values;
   a calculation unit configured to calculate probabilities for measurement values of the encoded Bell measurement by using the first measurement values, the second measurement values, and the error probabilities; and a decision unit configured to decide measurement values of the encoded Bell measurement, based on the probabilities calculated by the calculation unit, wherein the eigenvalue of the encoded Z operator and the eigenvalue of the encoded X operator being measurement values of the Bell measurement.

2. The apparatus according to claim 1, wherein the decision unit detects a maximum probability among the probabilities calculated by the calculation unit, and decides that a measurement result corresponding to the maximum probability is the measurement result of the encoded Bell measurement.

3. The apparatus according to claim 1, wherein the decision unit detects a maximum probability among the probabilities calculated by the calculation unit, compares the maximum probability with an error detection determination probability held in advance, decides that measurement values corresponding to the maximum probability are the measurement values of the encoded Bell measurement if the maximum probability is higher than the error detection determination probability, and decides that an error is detected if the maximum probability is not higher than the error detection determination probability.

4. The apparatus according to claim 1, wherein the first acquisition unit further acquires erasure information concerning physical qubits forming the first encoded qubit, and probabilistic gate failure information, the second acquisition unit further acquires erasure information concerning physical qubits forming the second encoded qubit, and probabilistic gate failure information, the holding unit updates the error probability based on the erasure information and the probabilistic gate failure information acquired by the first acquisition unit, and the erasure information and the probabilistic gate failure information acquired by the second acquisition unit, and the calculation unit calculates the probabilities for the measurement values of the encoded Bell measurement by using the erasure information and the probabilistic gate failure information acquired by the first acquisition unit, the erasure information and the probabilistic gate failure information acquired by the second acquisition unit, and the error probabilities updated by the holding unit.

5. A decoding apparatus for use in encoded Bell measurement for two encoded qubits encoded by using a Z·X separation type stabilizer code, comprising:

a first acquisition unit configured to acquire first measurement values of Z operator eigenvalue measurements performed for physical qubits forming a first encoded qubit of the two encoded qubits, in order to measure an eigenvalue of an encoded Z operator for the first encoded qubit;

a second acquisition unit configured to acquire second measurement values of X operator eigenvalue measurements performed for physical qubits forming a second encoded qubit of the two encoded qubits, in order to measure an eigenvalue of an encoded X operator for the second encoded qubit;

a holding unit configured to hold error probabilities for the first measurement values and the second measurement values;

a calculation unit configured to calculate probabilities for measurement values of the encoded Bell measurement by using the first measurement values, the second measurement values, and the error probabilities; and a decision unit configured to decide measurement values of the encoded Bell measurement, based on the probabilities calculated by the calculation unit wherein the eigenvalue of the encoded Z operator and the eigenvalue of the encoded X operator being measurement values of the Bell measurement.

6. The apparatus according to claim 5, wherein the Z·X separation type stabilizer code is a concatenated code obtained by concatenating Z·X separation type stabilizer codes.

7. The apparatus according to claim 6, wherein the calculation unit calculates probabilities for measurement values of each block at level 1 of the concatenated code by using the first measurement values, the second measurement values, the error probabilities, and level 1 encoding information of the concatenated code, and calculates probabilities for measurement values of each block at level (k+1) (k is an integer of not less than 1) of the concatenated code, by using probabilities for measurement values of each block at level k of the concatenated code, and level (k+1) encoding information of the concatenated code.

8. The apparatus according to claim 5, wherein the decision unit detects a maximum probability among the probabilities calculated by the calculation unit, and decides that a measurement result corresponding to the maximum probability is the measurement result of the encoded Bell measurement.

9. The apparatus according to claim 5, wherein the decision unit detects a maximum probability among the probabilities calculated by the calculation unit, compares the maximum probability with an error detection determination probability held in advance, decides that measurement values corresponding to the maximum probability are the measurement values of the encoded Bell measurement if the maximum probability is higher than the error detection determination probability, and decides that an error is detected if the maximum probability is not higher than the error detection determination probability.

10. The apparatus according to claim 5, wherein the first acquisition unit further acquires erasure information concerning physical qubits forming the first encoded qubit, and probabilistic gate failure information, the second acquisition unit further acquires erasure information concerning physical qubits forming the second encoded qubit, and probabilistic gate failure information, the holding unit updates the error probabilities based on the erasure information and the probabilistic gate failure information acquired by the first acquisition unit, and the erase information and the probabilistic gate failure information acquired by the second acquisition unit, and the calculation unit calculates the probabilities for the measurement values of the encoded Bell measurement by using the erasure information and the probabilistic gate failure information acquired by the first acquisition unit, the erasure information and the probabilistic gate failure information acquired by the second acquisition unit, and the error probabilities updated by the holding unit.

11. A decoding method for use in encoded Bell measurement for two encoded qubits, comprising:

acquiring first measurement values of measurements performed to measure an eigenvalue of an encoded Z operator with respect to a first encoded qubit of the two encoded qubits;

acquiring second measurement values of measurements performed to measure an eigenvalue of an encoded X operator with respect to a second encoded qubit of the two encoded qubits;

calculating probabilities for measurement values of the encoded Bell measurement by using the first measurement values, the second measurement values, and an error probabilities for the first measurement values and the second measurement values; and deciding measurement values of the encoded Bell measurement, based on the calculated probabilities, wherein the eigenvalue of the encoded Z operator and the eigenvalue of the encoded X operator being measurement values of the Bell measurement.

12. A decoding method for use in encoded Bell measurement for two encoded qubits encoded by using a Z·X separation type stabilizer code, comprising:

acquiring first measurement values of Z operator eigenvalue measurements performed for physical qubits forming a first encoded qubit of the two encoded qubits, in order to measure an eigenvalue of an encoded Z operator for the first encoded qubit;

acquiring second measurement values of X operator eigenvalue measurements performed for physical qubits forming a second encoded qubit of the two encoded qubits, in order to measure an eigenvalue of an encoded X operator for the second encoded qubit;

calculating probabilities for measurement values of the encoded Bell measurement by using the first measurement values, the second measurement values, and error probabilities for the first measurement values and the second measurement values; and deciding measurement values of the encoded Bell measurement, based on the calculated probabilities, wherein the eigenvalue of the encoded Z operator and the eigenvalue of the encoded X operator being measurement values of the Bell measurement.

* * * * *